US 8,748,934 B2

(12) United States Patent
Pan et al.

(10) Patent No.: US 8,748,934 B2
(45) Date of Patent: Jun. 10, 2014

(54) VERTICAL SELECTION TRANSISTOR, MEMORY CELL, AND THREE-DIMENSIONAL MEMORY ARRAY STRUCTURE AND METHOD FOR FABRICATING THE SAME (75) Inventors: Liyang Pan, Beijing (CN); Fang Yuan, Beijing (CN)

(73) Assignee: Tsinghua University, Beijing (CN)

( * ) Notice: Subject to any disclaimer, the term of this patent is extended or adjusted under 35 U.S.C. 154(b) by 0 days.

(21) Appl. No.: 13/520,166

(22) PCT Filed: Mar. 12, 2012

(86) PCT No.: PCT/CN2012/072213
§ 371 (c)(1),
(2), (4) Date: Jun. 29, 2012

(87) PCT Pub. No.: WO2013/044612
PCT Pub. Date: Apr. 4, 2013

(65) Prior Publication Data
US 2013/0207067 A1 Aug. 15, 2013

(30) Foreign Application Priority Data

Sep. 29, 2011 (CN) .......................... 2011 1 0298199
Sep. 29, 2011 (CN) .......................... 2011 1 0298260

(51) Int. Cl.
H01L 29/08 (2006.01)
H01L 27/24 (2006.01)
H01L 21/70 (2006.01)
H01L 29/78 (2006.01)

(52) U.S. Cl.
USPC  257/107; 257/4; 257/5; 257/66; 257/E27.007; 257/E21.085; 438/379; 438/383; 365/174

(58) Field of Classification Search
None
See application file for complete search history.

(56) References Cited

U.S. PATENT DOCUMENTS

| 5,412,598 | A | * | 5/1995 | Shulman | 365/174 |
| 8,335,100 | B2 | * | 12/2012 | Liu et al. | 365/148 |
| 8,441,881 | B1 | * | 5/2013 | Nemati | 365/227 |
| 2005/0128798 | A1 | * | 6/2005 | Kang | 365/163 |
| 2010/0232200 | A1 | * | 9/2010 | Shepard | 365/51 |
| 2012/0228629 | A1 | * | 9/2012 | Nemati et al. | 257/77 |

* cited by examiner

Primary Examiner — Thomas L Dickey
Assistant Examiner — Joseph Schoenholtz
(74) Attorney, Agent, or Firm — Houtteman Law LLC (57) ABSTRACT The present disclosure discloses a vertical selection transistor, a memory cell having the vertical selection transistor, a three-dimensional memory array structure and a method for fabricating the three-dimensional memory array structure. The vertical selection transistor comprises: an upper electrode; a lower electrode; a first semiconductor layer, a second semiconductor layer, a third semiconductor layer and a fourth semiconductor layer vertically stacked between the lower electrode and the upper electrode; and a gate stack formed on a side of the second semiconductor layer, in which the first semiconductor layer and the third semiconductor layer are first type doped layers, the second semiconductor layer and the fourth semiconductor layer are second type doped layers, and a doping concentration of the second semiconductor layer is lower than that of the first semiconductor layer or that of the third semiconductor layer respectively.

19 Claims, 6 Drawing Sheets

VERTICAL SELECTION TRANSISTOR, MEMORY CELL, AND THREE-DIMENSIONAL MEMORY ARRAY STRUCTURE AND METHOD FOR FABRICATING THE SAME

CROSS-REFERENCE TO RELATED APPLICATION

This application claims priority to and benefits of Chinese Patent Application Serial No. 201110298199.7 and Chinese Patent Application Serial No. 201110298260.8, both filed with the State Intellectual Property Office of P. R. China on Sep. 29, 2011, the entire contents of which are incorporated herein by reference.

FIELD

The present disclosure relates to semiconductor design and fabrication field, and more particularly to a vertical selection transistor, a memory cell, and a three-dimensional memory array structure and a method for fabricating the same.

BACKGROUND

As a new type of nonvolatile storage technology, a resistive random access memory (RRAM) and a phase change memory (PCM) with advantages of high storage density, low power consumption, fast read and write speeds, long-time retention, multiple-bit storage, small cell area, compatibility with a complementary metal oxide semiconductor (CMOS) technology, etc. have drawn more attention. Particularly, RRAM and PCM which may realize three-dimensional integration are becoming a hot research topic of high-density memory device, and a multi-layer stacked crossbar structure is the most attractive structure. However, the multi-layer stacked structure of a three-dimensional memory device may cause problems such as disturbance between memory cells in a same layer or between different layers, leakage current and fabrication difficulty.

Currently, a one transistor one resistor (1T1R) structure and a one diode one resistor (1D1R) structure are the most popular cell structures for a three-dimensional RRAM and a three-dimensional PCM. The 1T1R structure means that one MOS transistor is connected in series with one variable resistor for selecting or isolating the variable resistor. However, the transistor as an active device needs to be fabricated in a front-end procedure, and a minimum cell area restricted by the transistor is unfavorable to high-density three-dimensional stacking of the memory devices. The 1D1R structure means that one diode is connected in series with one variable resistor, in which selecting the resistor is realized by a rectification property of the diode. The diode properties such as high forward current density, high on/off current ratio and processing compatibility are important selection criteria. Although a diode based on monocrystalline silicon has high current density and high rectification ratio, the diode needs high processing temperature and is difficult to fabricate on a metal electrode. Although a diode based on a metal oxide has good processing compatibility, the forward current density of the diode is not ideal.

Therefore, there is a need for a RRAM or a PCM based on a new type of selection transistor that has simple memory cell structure with independence on a silicon substrate, multi-layer stacked structure and three-dimensional high-density storage.

SUMMARY

The present disclosure is aimed to solve at least one of the problems, particularly defects of complicated memory cell structure and low storage density.

According to a first aspect of the present disclosure, a vertical selection transistor is provided, comprising: an upper electrode; a lower electrode; a first semiconductor layer, a second semiconductor layer, a third semiconductor layer and a fourth semiconductor layer vertically stacked between the lower electrode and the upper electrode; and a gate stack formed on a side of the second semiconductor layer, in which the first semiconductor layer and the third semiconductor layer are first type doped layers, the second semiconductor layer and the fourth semiconductor layer are second type doped layers, and a doping concentration of the second semiconductor layer is lower than that of the first semiconductor layer or that of the third semiconductor layer respectively, so that a vertical MOS transistor is formed by the first semiconductor layer, the second semiconductor layer, the third semiconductor layer and the gate stack, and a vertical diode is formed by the third semiconductor layer and the fourth semiconductor layer.

In one embodiment, a material for each of the first, second, third and fourth semiconductor layers is doped polycrystalline semiconductor material such as doped polycrystalline silicon or doped polycrystalline germanium. Compared with the a monocrystalline material which needs to be prepared at a high temperature, a polycrystalline material may be prepared by a method such as an epitaxy at a lower temperature, and thus the vertical selection transistor fabricated using the polycrystalline material may not disadvantageously affect performances of resistors or other components of the memory device.

In one embodiment, a thickness of each of the first, second, third and fourth semiconductor layers is within a range from 10 nm to 200 nm, and a thickness of the second semiconductor layer or a thickness of the third semiconductor layer is larger than that of the first semiconductor layer or that of the fourth semiconductor layer. Such a gate-control PNPN selection transistor may approximately be two parasitic bipolar transistors interacting with each other to generate a latch-up effect when working. Therefore, increasing the thicknesses of the second and third semiconductor layers is equivalent to increasing the thicknesses of base regions of the two bipolar transistors, thus reducing magnification of the two bipolar transistors and suppressing the latch-up effect accordingly.

According to a second aspect of the present disclosure, a memory cell is provided, comprising: a resistance switching unit or a phase change unit; and a selection transistor according to the first aspect of the present disclosure, in which the vertical selection transistor is connected in series with the resistance switching unit or with the phase change unit.

In one embodiment, the resistance switching unit or the phase change unit is a film storage medium formed on an upper surface of the upper electrode or a lower surface of the lower electrode of the vertical selection transistor.

In one embodiment, a material for the resistance switching unit comprises $NiO_xO_y$, $Nb_xO_y$, $Ti_xO_y$, $Hf_xO_y$, $Mg_xO_y$, $Co_xO_y$, $Cr_xO_y$, $V_xO_y$, $Zn_xO_y$, $Al_xO_y$, $Zr_xO_y$, or $Al_xN_y$, in which each of x and y is within a range from 0 to 1.

In one embodiment, a material for the phase change unit comprises a Ge—Se—Te chalcogenide compound.

According to a third aspect of the present disclosure, a three-dimensional memory array structure is provided, comprising: a plurality of array layers, each of the plurality of array layers being stacked with another, each of the plurality of array layers including a plurality of rows of memory cells in a first direction and a plurality of columns of memory cells in a second direction. Each memory cell comprises: an upper electrode; a lower electrode; a first semiconductor layer, a second semiconductor layer, a third semiconductor layer and a fourth semiconductor layer vertically stacked between the lower electrode and the upper electrode; and a resistance switching unit or a phase change unit formed on the upper electrode, in which the first semiconductor layer and the third semiconductor layer are first type doped layers, the second semiconductor layer and the fourth semiconductor layer are second type doped layers, and a doping concentration of the second semiconductor layer is lower than that of the first semiconductor layer or that of the third semiconductor layer. The plurality of columns of memory cells are divided into a plurality of pair columns of memory cells and a common gate stack is located between the second semiconductor layers of two adjacent memory cells in a same row and belonging to a same pair column so as to increase space utilization rate.

In one embodiment, the memory cells in two adjacent array layers are reversely disposed.

In one embodiment, the lower electrodes of memory cells of each row of memory cells are connected to form a first common electrode in the first direction, and a second common electrode is provided on the resistance switching units or the phase change units of memory cells of each column of memory cells in the second direction.

In one embodiment, each first common electrode or each second common electrode between two adjacent array layers is shared by the two adjacent array layers, thus increasing space utilization rate, simplifying fabrication process and reducing cost.

In one embodiment, a material for each of the first, second, third and fourth semiconductor layers is doped polycrystalline silicon or doped polycrystalline germanium. Compared with the monocrystalline material which needs to be prepared at a high temperature, the polycrystalline material may be prepared by a method such as an epitaxy at a lower temperature, and thus the vertical selection transistor fabricated using the polycrystalline material may not disadvantageously affect performances of resistors or other components of the memory device.

In one embodiment, a thickness of each of the first, second, third and fourth semiconductor layers is within a range from 10 nm to 200 nm.

In one embodiment, a thickness of the second semiconductor layer or a thickness of the third semiconductor layer is larger than that of the first semiconductor layer or that of the fourth semiconductor layer.

In one embodiment, a material for each of the first common electrodes, the second common electrodes, the upper electrode and the lower electrode comprises heavily doped polycrystalline silicon or metal.

In one embodiment, isolation dielectrics are filled between adjacent memory cells, between adjacent first common electrodes and between adjacent second common electrodes so as to isolate each memory cell, each first common electrode and each second common electrode.

In one embodiment, the three-dimensional memory array structure is formed on a substrate with an insulating layer.

According to a fourth aspect of the present disclosure, a method for fabricating a three-dimensional memory array structure is provided, comprising steps of: (A) providing a substrate with an insulating layer; (B) forming a first dielectric layer on the insulating layer, and treating the first dielectric layer to form a plurality of first common electrodes in a first direction; (C) forming a first semiconductor layer, a second semiconductor layer, a third semiconductor layer, a fourth semiconductor layer, an electrode layer and a resistance switching material layer or a phase change material layer on the plurality of first common electrodes in succession; etching the resistance switching material layer or the phase change material layer, the electrode layer, the fourth semiconductor layer, the third semiconductor layer, the second semiconductor layer, and the first semiconductor layer in succession to form a plurality of rows of memory cells in the first direction and a plurality of columns of memory cells in a second direction; and then forming a second dielectric layer on the first dielectric layer to isolate each memory cell, in which the first semiconductor layer and the third semiconductor layer are first type doped layers, the second semiconductor layer and the fourth semiconductor layer are second type doped layers, and a doping concentration of the second semiconductor layer is lower than that of the first semiconductor layer or that of the third semiconductor layer; (D) dividing the plurality of columns of memory cells into a plurality of pair columns of memory cells and treating the second dielectric layer between each pair column of memory cells to form a common gate stack between the second semiconductor layers of two adjacent memory cells in a same row and belonging to a same pair column; (E) forming a third dielectric layer on the second dielectric layer and on the resistance switching material layer or the phase change material layer, and treating the third dielectric layer to form a plurality of second common electrodes on each column of memory cells in the second direction; and (F) forming the resistance switching material layer or the phase change material layer, the electrode layer, the fourth semiconductor layer, the third semiconductor layer, the second semiconductor layer and the first semiconductor layer on the plurality of second common electrodes in succession; then etching the first semiconductor layer, the second semiconductor layer, the third semiconductor layer, the fourth semiconductor layer, the electrode layer, and the resistance switching material layer or the phase change material layer in succession to form a plurality of memory cells on each second common electrode; and then forming a fourth dielectric layer to isolate the plurality of memory cells.

In one embodiment, step B to step F are repeated on the formed memory array structure to form a plurality of stacked array layers.

In one embodiment, a material for each of the first, second, third and fourth semiconductor layers comprises doped polycrystalline silicon or doped polycrystalline germanium.

In one embodiment, a material for each of the first common electrodes, the second common electrodes, the upper electrode and the lower electrode comprises heavily doped polycrystalline silicon or metal.

The present disclosure provides a vertical selection transistor, a memory cell having the vertical selection transistor, a three-dimensional memory array structure formed by arranging the memory cells in a three-dimensional space and a method for fabricating the three-dimensional memory array structure. By using the vertical selection transistor with high on/off current ratio to form the memory cell, problems such as disturbance between adjacent memory cells and current leakage are effectively improved. In addition, the structure of the memory cell is simplified without dependence on a silicon substrate, a multi-layer stacked structure is realized, and the storage density is increased.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Figure 1:
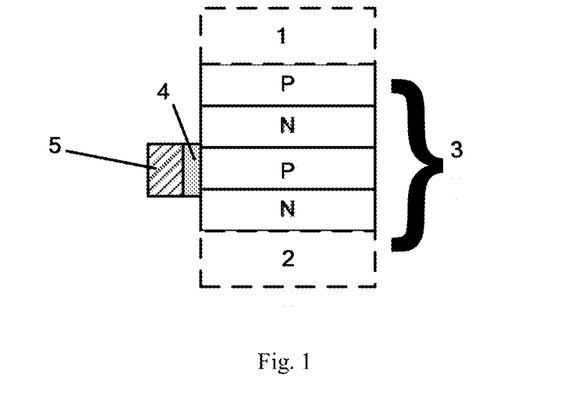
FIG. 1 is a structural schematic view of a vertical selection transistor according to an embodiment of the present disclosure.

FIG. 1 is a structural schematic view of a vertical selection transistor according to an embodiment of the present disclosure. As shown in FIG. 1, the vertical selection transistor comprises: an upper electrode 1, a lower electrode 2 and a semiconductor body 3 formed between the lower electrode 2 and the upper electrode 1. The semiconductor body 3 comprises a first semiconductor layer, a second semiconductor layer, a third semiconductor layer and a fourth semiconductor layer vertically stacked from bottom to top. In one embodiment, the first semiconductor layer and the third semiconductor layer are N-type doped layers, and the second semiconductor layer and the fourth semiconductor layer are P-type doped layers. A gate stack comprising a gate oxide 4 and a gate 5 is formed on a side of the second semiconductor layer. A doping concentration of the second P-type semiconductor layer is lower than that of the first N-type semiconductor layer or that of the third N-type semiconductor layer respectively, that is, a channel of a MOS transistor is formed between the second P-type semiconductor layer and the fourth P-type semiconductor layer so that a structure equivalent to a vertical MOS transistor is formed by the first N-type semiconductor layer, the second P-type semiconductor layer, the third N-type semiconductor layer (N-P-N) and the gate stack; and a structure equivalent to a vertical diode is formed by the third N-type semiconductor layer and the fourth P-type semiconductor layer (N-P). The whole vertical selection transistor is equivalent to one diode and one MOS transistor which are connected in series between the upper electrode 1 and the lower electrode 2.

In one embodiment, a material for each of the first, second, third and fourth semiconductor layers may be a doped polycrystalline semiconductor material such as doped polycrystalline silicon or doped polycrystalline germanium. Compared with a monocrystalline material which needs to be prepared at a high temperature, the polycrystalline material may be prepared by a method such as an epitaxy at a lower temperature, and thus the vertical selection transistor fabricated using the polycrystalline material may not disadvantageously affect performances of resistors or other components of the memory device.

In one embodiment, a thickness of each of the first, second, third and fourth semiconductor layers is within a range from 10 nm to 200 nm. Preferably, a thickness of the second semiconductor layer is larger than that of the first semiconductor layer or that of the fourth semiconductor layer, and a thickness of the third semiconductor layer is larger than that of the first semiconductor layer or that of the fourth semiconductor layer. Such a gate-control PNPN selection transistor may approximately be two parasitic bipolar transistors interacting with each other to generate a latch-up effect when working. Therefore, increasing the thicknesses of the second and third semiconductor layers is equivalent to increasing thicknesses of base regions of the two bipolar transistors, thus reducing magnification of the two bipolar transistors and suppressing the latch-up effect accordingly.

It should be noted that, although an embodiment of the present disclosure is described based on the fact that the first semiconductor layer and the third semiconductor layer are N-type doped layers and the second semiconductor layer and the fourth semiconductor layer are P-type doped layers, in a practical application, the present disclosure may also be realized by the fact that the first semiconductor layer and the third semiconductor layer are P-type doped layers and the second semiconductor layer and the fourth semiconductor layer are N-type doped layers.

In one embodiment, a working process of the vertical selection transistor 6 may be illustrated as follows: applying a voltage to the gate stack to make the MOS transistor turn on, and simultaneously applying a voltage to the upper electrode 1 and the lower electrode 2 to make the diode forward turned on and conductive with the MOS transistor so as to turn on the vertical selection transistor 6; applying a voltage to the gate stack to turn off the MOS transistor, and simultaneously applying a voltage to the upper electrode 1 and the lower electrode 2 to turn off the diode so as to turn off the vertical selection transistor 6. Since the vertical selection transistor 6 in an off state is equivalent to two reverse biased PN junction diodes connected in series with one forward biased PN junction diode, a reverse leakage current is greatly reduced.

Figure 2:
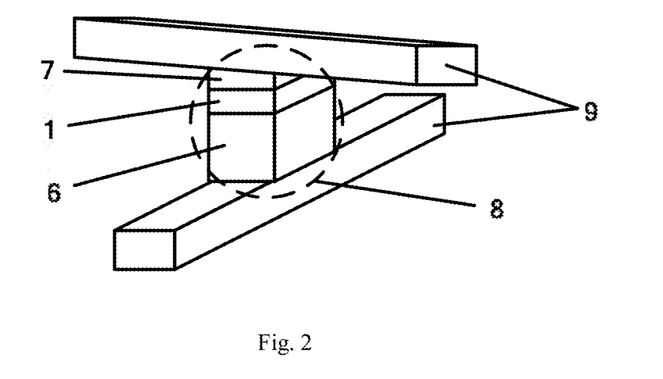
FIG. 2 is a structural schematic view of a memory cell according to an embodiment of the present disclosure.

FIG. 2 is a structural schematic view of a memory cell according to an embodiment of the present disclosure. As shown in FIG. 2, the memory cell comprises the vertical selection transistor 6 and a resistance switching unit or a phase change unit 7 which is connected in series with the vertical selection transistor 6. In one embodiment, the resistance switching unit or the phase change unit 7 is a film storage medium connected to the vertical selection transistor 6 by an electrode 1. In one embodiment, a material for the resistance switching unit 7 may comprise compounds such as $Ni_xO_y$, $Nb_xO_y$, $Ti_xO_y$, $Hf_xO_y$, $Mg_xO_y$, $Co_xO_y$, $Cr_xO_y$, $V_xO_y$, $Zn_xO_y$, $Al_xO_y$, $Zr_xO_y$, or $Al_xN_y$, or polymers, in which each of x and y is within a range from 0 to 1. A material for the phase change unit 7 may comprise a Ge—Se—Te chalcogenide compound. One memory cell 8 is shown by a dashed circle in FIG. 2, in which an upper common electrode 9 is connected to an upper end of the memory cell, and a lower common electrode 9 is connected to a lower end of the memory cell. In one embodiment, the lower electrode 2 may be used as the lower common electrode 9. A material for each of the upper electrode 1, the lower electrode 2 and the upper and lower common electrodes 9 may comprise heavily doped polycrystalline silicon or metal.

In one embodiment, a working process of the memory cell may be illustrated as follows: when the vertical selection transistor is turned on, the resistance switching unit or the phase change unit is selected; when the vertical selection transistor is turned off, the resistance switching unit or the phase change unit is not selected.

Figure 3:
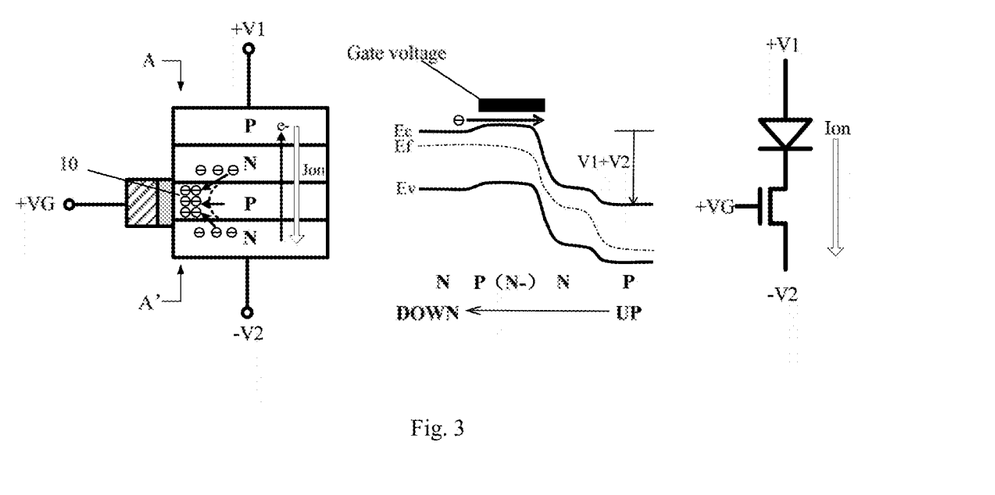
FIG. 3 is a schematic principle diagram, a schematic energy band diagram and an equivalent circuit diagram of a vertical selection transistor in an on state according to an embodiment of the present disclosure.

FIG. 3 is a principle diagram, a schematic energy band diagram and an equivalent circuit diagram of a vertical selection transistor in an on state according to an embodiment of the present disclosure. When a suitable positive voltage +VG is applied to the gate, electrons around an interface between the second P-type semiconductor layer and the gate stack as well as a part of electrons in the third and first N-type semiconductor layers move toward the surface of the second P-type semiconductor layer due to an attraction of the gate voltage +VG so as to gradually form a reverse electron channel 10, i.e., a N-region. As shown by a dashed line in the schematic energy band diagram in FIG. 3, the MOS transistor is turned on. When applying a suitable forward bias voltage to the upper and lower common electrodes of the vertical selection transistor at this moment, for instance, applying a positive voltage +V1 to the upper common electrode and applying a ground voltage or a negative voltage −V2 to the lower common electrode, the upper PN diode is forward conducted. Thus, an up-to-down electric field is formed in the semiconductor body of the vertical selection transistor so that electrons in the semiconductor body flow in a down-to-up direction under the electric field to form an up-to-down turn-on current $J_{on}$. It also may be seen from the schematic energy band diagram along an A-A' direction that when applying the forward gate voltage +VG, the surface of the second P-type semiconductor layer is reversed to form the N-region, of which a conduction band bottom Ec and a valence band top Ev are downward. A voltage drop V1+V2 between the upper common electrode and the lower common electrode enables energy bands of the fourth P-type semiconductor layer and the third N-type semiconductor layer to bend downwards to different extents. In this case, a potential barrier that needs to be overcome by the electrons is reduced so that an electron flow from the first N-type semiconductor layer to the fourth P-type semiconductor layer is formed. As shown in the equivalent circuit diagram in FIG. 3, the vertical selection transistor in an on state may be equivalent to a forward conducted diode connected with a MOS transistor in an on state in series. Since a resistance of the vertical selection transistor in an on state is quite small, a part of the voltage difference V1+V2 between the upper common electrode and the lower common electrode distributed to the vertical selection transistor is extremely small while most of the voltage difference V1+V2 is distributed to the resistance switching unit or the phase change unit so that the memory cell having the vertical selection transistor is selected.

Figure 4:
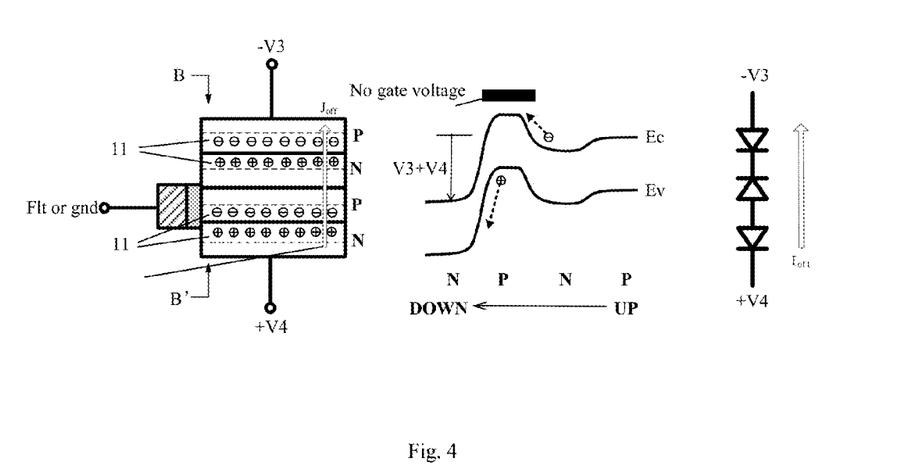
FIG. 4 is a schematic principle diagram, a schematic energy band diagram and an equivalent circuit diagram of a vertical selection transistor in an off state according to an embodiment of the present disclosure.

FIG. 4 is a schematic principle diagram, a schematic energy band diagram and an equivalent circuit diagram of a vertical selection transistor in an off state according to an embodiment of the present disclosure. When a ground voltage is applied to the gate or the gate is floated, the reverse electron channel 10 will not be formed around the surface of the second P-type semiconductor layer so that the MOS transistor is turned off. When applying a suitable reversed bias voltage to the upper and lower common electrodes of the vertical selection transistor at this moment, for instance, applying a negative voltage −V3 to the upper common electrode and applying a ground voltage or a positive voltage +V4 to the lower common electrode, a PN diode formed by the fourth P-type semiconductor layer and the third N-type semiconductor layer as well as a PN diode formed by the second P-type semiconductor layer and the first N-type semiconductor layer are both reverse biased, thus forming a reversed bias depletion region 11. In this case, merely a very small reverse biased current $J_{off}$ flows through the vertical selection transistor. Although a PN diode formed by the second P-type semiconductor layer and the third N-type semiconductor layer is forward biased at the moment, the whole vertical selection transistor is still turned off because the reverse biased diodes connect to the upper and low ends of the forward biased diode respectively. Compared with a conventional reverse biased diode, the backward leakage current $J_{off}$ flowing through the vertical selection transistor is smaller. It also may be seen from the schematic energy band diagram along an B-B' direction that without voltage applied to the gate, the reversed bias voltages applied to the upper and lower common electrodes form a voltage drop V3+V4 between the upper and lower common electrodes, which enables an energy band of the first N-type semiconductor layer to bend downwards and enables an energy band of the third N-type semiconductor layer to slightly bend upwards. In this case, potential barriers that need to be overcome by electrons and holes are increased so that it is difficult for the electrons and holes to flow in an up-to-down direction as shown by a dashed arrow in the schematic energy band diagram in FIG. 4. As shown by the equivalent circuit diagram in FIG. 4, the vertical selection transistor in an off state may be equivalent to three diodes connected in series. Since the resistance of the vertical selection transistor in an off state is quite large and the leakage current is quite small, a part of the voltage difference V3+V4 between the upper common electrode and the lower common electrode distributed to the vertical selection transistor is extremely large so that the memory cell having the vertical selection transistor is turned off, that is, the memory cell having the vertical selection transistor is not selected.

Figure 5:
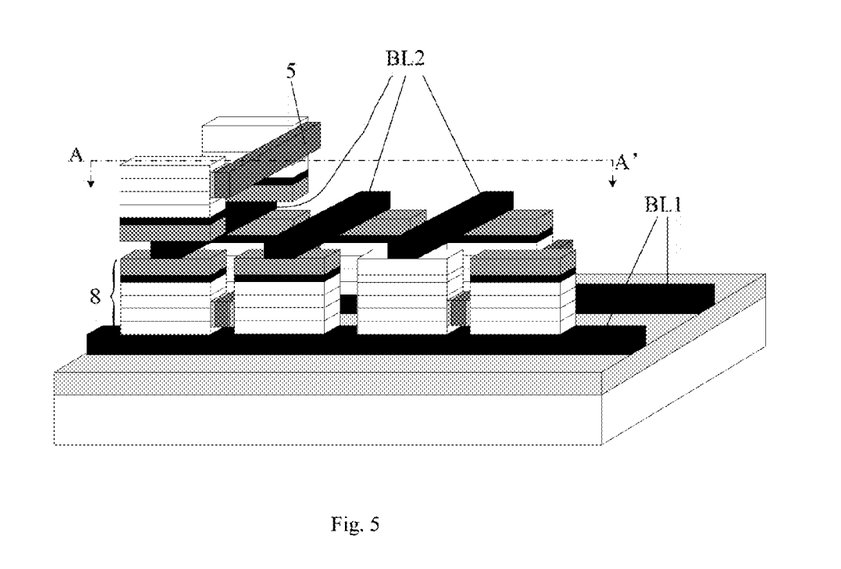
FIG. 5 is a structural schematic view of a three-dimensional memory array structure according to an embodiment of the present disclosure.
Figure 6:
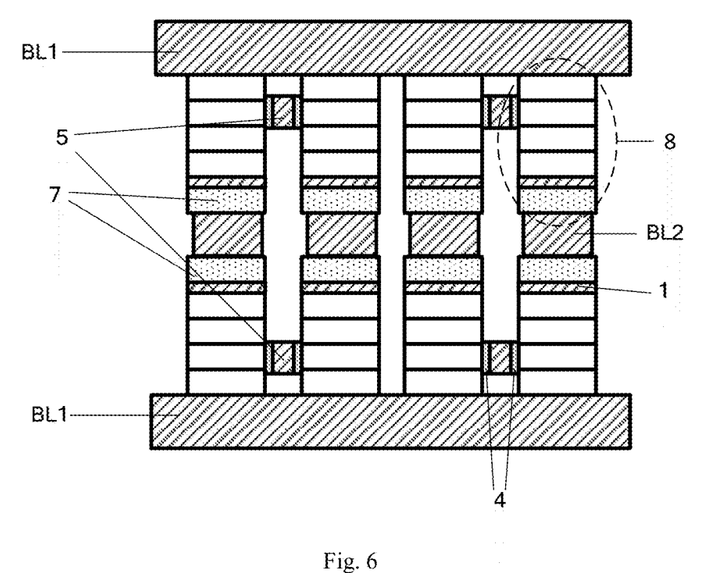
FIG. 6 is a cross-sectional view of the three-dimensional memory array structure along an A-A' direction shown in FIG. 5.

Furthermore, a three-dimensional memory array structure based on the gate control PNPN vertical selection transistor is provided according to a third aspect of the embodiment of the present disclosure. FIG. 5 is a structural schematic view of a three-dimensional memory array structure according to an embodiment of the present disclosure. FIG. 6 is a cross-sectional view of the three-dimensional memory array structure along an A-A' direction shown in FIG. 5. A cross-sectional view of one memory cell 8 is shown by a dashed circle shown in FIG. 6.

With reference to FIG. 5 and FIG. 6, the three-dimensional memory array structure according to an embodiment of the present disclosure comprises: a plurality of array layers, each of the plurality of array layers being stacked with another, each of the plurality of array layers including a plurality of rows of memory cells 8 in a first direction and a plurality of columns of memory cells 8 in a second direction. With reference to FIGS. 1-2, each memory cell 8 comprises: an upper electrode 1; a lower electrode 2; a first semiconductor layer, a second semiconductor layer, a third semiconductor layer and a fourth semiconductor layer vertically stacked between the lower electrode 2 and the upper electrode 1; and a resistance switching unit or a phase change unit 7 formed on the upper electrode 1. In one embodiment, the first semiconductor layer and the third semiconductor layer are first type doped layers, the second semiconductor layer and the fourth semiconductor layer are second type doped layers, and the doping concentration of the second semiconductor layer is lower than that of the first semiconductor layer or that of the third semiconductor layer. The plurality of columns of memory cells 8 are divided into a plurality of pair columns of memory cells. A common gate stack 5 is located between the second semiconductor layers of two adjacent memory cells in a same row and belonging to a same pair column. In one embodiment, each common gate stack 5 comprises one gate and two gate oxides, and each gate oxide is formed on the second semiconductor layer of each of the two adjacent memory cells in a same row and belonging to a same pair column, and the gate is formed between the two gate oxides. The common gate stack may increase the space utilization rate of the three-dimensional memory array structure.

In one embodiment, the first direction is perpendicular to the second direction. The memory cells 8 in two adjacent array layers are reversely disposed. The lower electrodes of memory cells of each row of memory cells are connected to form a first common electrode BL1 in the first direction, and a second common electrode BL2 is provided on the resistance switching units or the phase change units of memory cells of each column of memory cells in the second direction. Preferably, each first common electrode BL1 or each second common electrode BL2 between two adjacent array layers is shared by the two adjacent array layers, thus increasing space utilization rate, simplifying fabrication process and reducing cost. For instance, two memory cells located in two adjacent array layers are disposed reversely and connected to a same second common electrode BL2 as shown in FIG. 5.

In one embodiment, a material for each of the first, second, third and fourth semiconductor layers is doped polycrystalline silicon or doped polycrystalline germanium. Compared with the monocrystalline material which needs to be prepared at a high temperature, the polycrystalline material may be prepared by a method such as an epitaxy at a lower temperature, and thus the vertical selection transistor fabricated using the polycrystalline material may not disadvantageously affect performances of resistors or other components of the memory device.

In one embodiment, a thickness of each of the first, second, third and fourth semiconductor layers is within a range from 10 nm to 200 nm.

In one embodiment, a thickness of the second semiconductor layer or a thickness of the third semiconductor layer is larger than that of the first semiconductor layer or that of the fourth semiconductor layer.

In one embodiment, a material for each of the first common electrodes, the second common electrodes, the upper electrode and the lower electrode comprises heavily doped polycrystalline silicon or metal.

In one embodiment, isolation dielectrics are filled between adjacent memory cells, between adjacent first common electrodes and between adjacent second common electrodes so as to isolate each memory cell, each first common electrode and each second common electrode.

In one embodiment, the three-dimensional memory array structure is formed on a substrate with an insulating layer.

Figure 7:
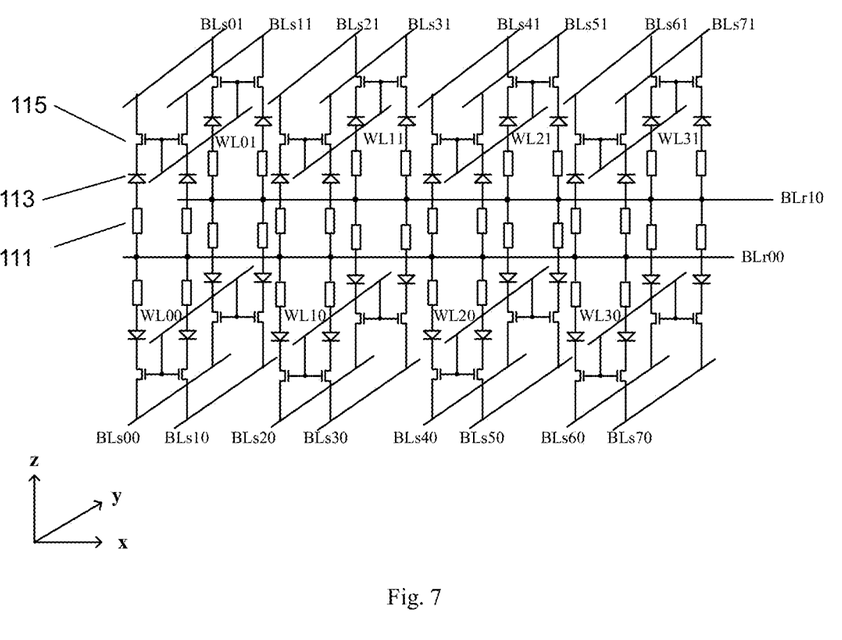
FIG. 7 is an equivalent circuit diagram of a three-dimensional memory array structure according to an embodiment of the present disclosure.

FIG. 7 is an equivalent circuit diagram of a three-dimensional memory array structure according to an embodiment of the present disclosure. Each memory cell is equivalent to one resistance switching unit or one phase change unit 111, one diode 113 and one MOS transistor 115 connected in series. An orthogonal coordinate system xyz is provided in FIG. 7 for conveniently describing the three-dimensional memory array structure. A word line WL in a y direction is a line formed by gates of the vertical selection transistors. A bit line BL in an x direction or the y direction is a line formed by upper common electrodes or lower common electrodes of the memory cells. A naming rule for the word lines and the bit lines may be illustrated as follows: as shown in FIG. 7, for the word line WLxz in the y direction, a subscript x represents a position of the word line WLxz in the x direction, and a subscript z represents a position of the word line WLxz in a z direction, that is, a serial number of the array layer from the substrate up; for the bit line BLsxz in the y direction, a subscript s means that the bit line BLsxz is connected with the vertical selection transistor, a subscript x respresents a position of the bit line BLsxz in the x direction, and a subscript z represents a position of the bit line BLsxz in the z direction, that is, a serial number of the array layer from the substrate up; and for the bit line BLryz in the x direction, a subscript r means that the bit line BLryz is connected with the resistance switching unit or with the phase change unit, a subscript y respresents a position of the bit line BLryz in the y direction, and a subscript z represents a position of the bit line BLryz in the z direction, that is, a serial number of the array layer from the substrate up.

A method for fabricating the three-dimensional memory array structure is provided according to a fourth aspect of the embodiment of the present disclosure. The method comprises the following steps.

Figure 8:
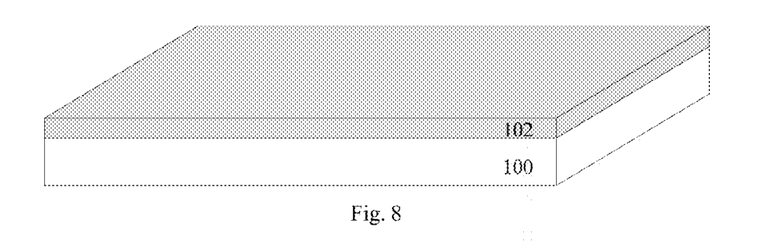
FIGS. 8-14 are structural schematic views of intermediate statuses of a three-dimensional memory array structure formed in steps of a method for fabricating a three-dimensional memory device structure according to an embodiment of the present disclosure.

In step S1: a substrate with an insulating layer is provided. In one embodiment, the substrate may be formed by forming the insulating layer on a semiconductor substrate. As shown in FIG. 8, an insulating layer 102 is grown on a Si substrate 100. A material for the insulating layer 102 may be any dielectric material, such as $SiO_2$, and may be formed by thermal oxidation, chemical vapor deposition (CVD), physical vapor deposition (PVD), atomic layer deposition (ALD) and/or other suitable processes. It should be noted that, each insulating layer and each dielectric layer in the embodiments of the present disclosure may be formed by the processes described above or other processes known in the art.

Figure 9:
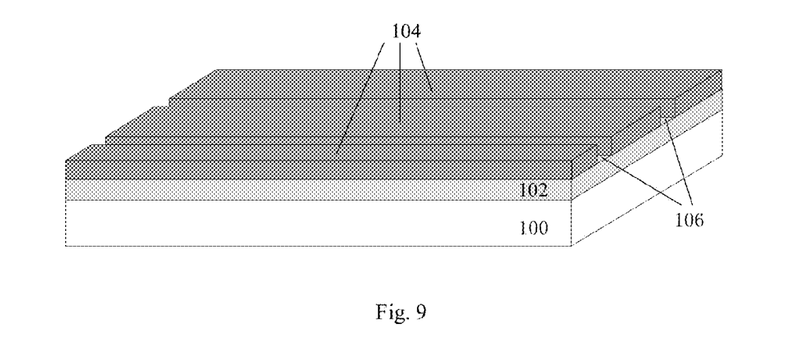
Figure 10:
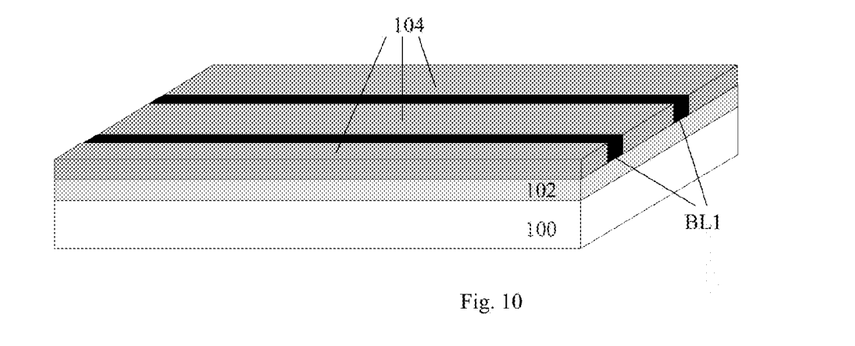

In step S2: a first dielectric layer 104 is formed on the insulating layer 102, and the first dielectric layer 104 is treated to form a plurality of first common electrodes BL1 in a first direction. Specifically, as shown in FIG. 9, the first dielectric layer 104 such as a $Si_3N_4$ layer is formed on the insulating layer 102, and then a plurality of first trenches 106 are formed by etching the first dielectric layer 104 until the $SiO_2$ layer 102 is exposed. Then, an electrode material such as N-type heavily doped polycrystalline silicon or metal is deposited followed by chemical mechanical polishing (CMP) to form the plurality of first common electrodes BL1 in the first direction, as shown in FIG. 10.

In step S3: a first semiconductor layer 106, a second semiconductor layer 108, a third semiconductor layer 110, a fourth semiconductor layer 112, an electrode layer 114 and a resistance switching material layer 116 or a phase change material layer 116 are formed on the plurality of first common electrodes BL1 in succession; the resistance switching material layer 116 or the phase change material layer 116, the electrode layer 114, the fourth semiconductor layer 112, the third semiconductor layer 110, the second semiconductor layer 108, and the first semiconductor layer 106 are etched in succession to form a plurality of rows of memory cells 8 in the first direction and a plurality of columns of memory cells 8 in a second direction; and then a second dielectric layer 118 is formed on the first dielectric layer 104 to isolate each memory cell 8, in which the first semiconductor layer 106 and the third semiconductor layer 110 are first type doped layers, the second semiconductor layer 108 and the fourth semiconductor layer 112 are second type doped layers, and a doping concentration of the second semiconductor layer 108 is lower than that of the first semiconductor layer 106 or that of the third semiconductor layer 110. In one embodiment, a material for each of the first, second, third and fourth semiconductor layers 106, 108, 110, 112 may comprise doped polycrystalline silicon or doped polycrystalline germanium, and a material for the electrode layer 114 may comprise heavily doped polycrystalline silicon or metal.

Figure 11:
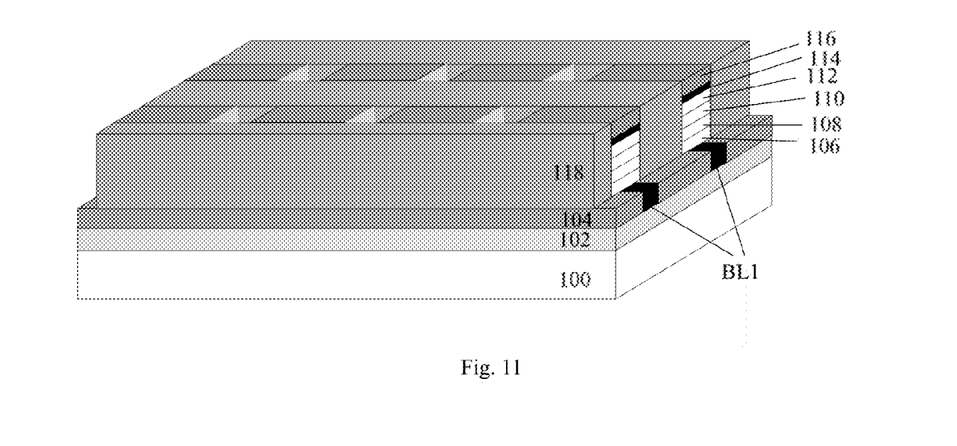

Specifically, as shown in FIG. 11, N, P N and P-type doped polycrystalline silicon layers with various doping concentrations, an N-type heavily doped polycrystalline silicon layer and a resistance switching material layer or a phase change material layer are deposited in succession on the $Si_3N_4$ layer 104 and the first common electrodes BL1, and then are etched in reverse succession to form a plurality of respective memory cells 8. Each formed memory cell 8 having a width slightly larger than or equal to that of BL1 and a suitable length is just located on each first common electrode BL1. In one embodiment, the doped polycrystalline silicon layers may be formed by epitaxy growth, CVD or PVD, and the resistance switching material layer or the phase change material layer may be formed by ALD, PVD or sputtering. Then, the dielectric material such as $SiO_2$ is filled between the memory cells 8 followed by CMP to form the second dielectric layer 118.

Figure 12:
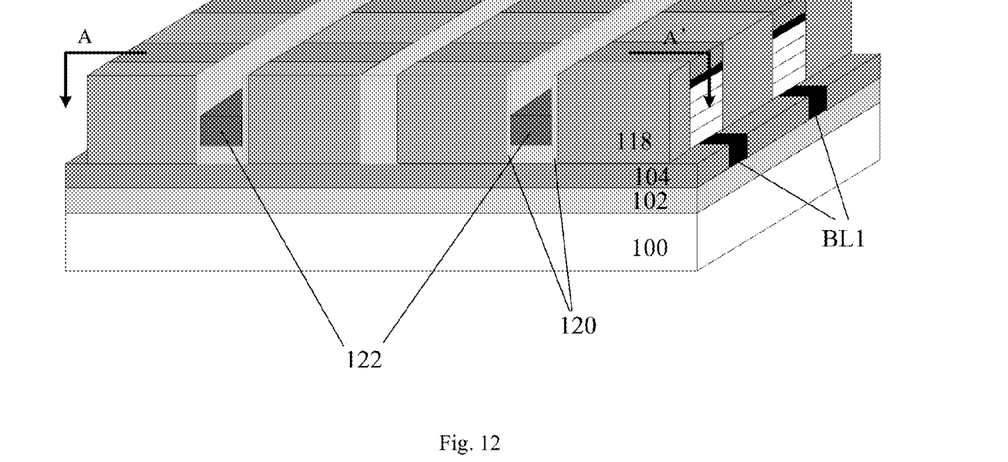
Figure 13:
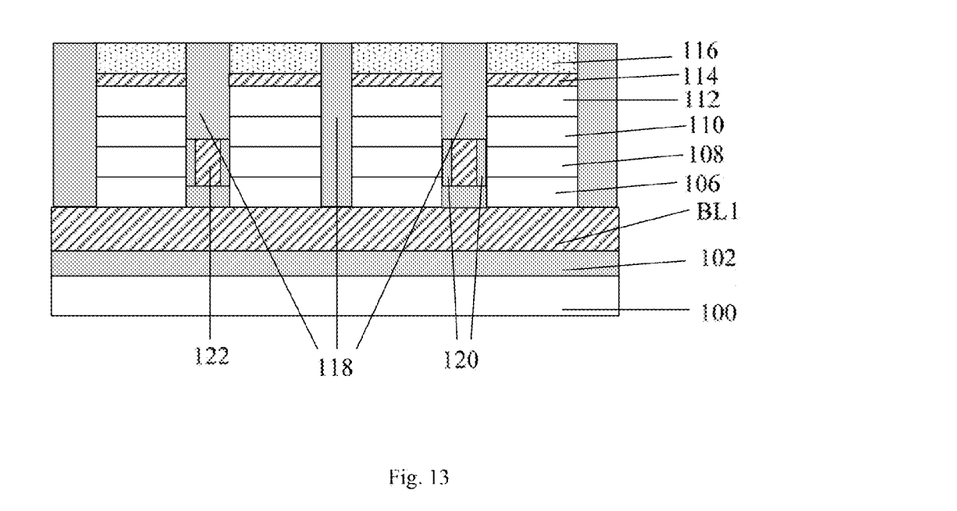

In step S4: the plurality of columns of memory cells 8 are divided into a plurality of pair columns of memory cells and the second dielectric layer between each pair column of memory cells is treated to form a common gate stack between the second semiconductor layers 108 of two adjacent memory cells 8 in a same row and belonging to a same pair column. The common gate stack comprises a gate oxide 120 and a gate 122 as shown in FIG. 12. Specifically, as shown in FIG. 12, the second dielectric layer 118 between two adjacent memory cells sharing one gate stack is etched to form a plurality of second trenches having a width slightly smaller than a space between adjacent memory cell columns, an oxide such as $SiO_2$ may be deposited in the plurality of second trenches so that the oxide deposited on both side walls of each trench may be the gate oxide 120, and then N-type heavily doped polycrystalline silicon may be deposited in the second trenches to form a polycrystalline silicon gate as the common gate 122. A cross-sectional view along an A-A' direction shown in FIG. 12 is shown in FIG. 13.

Figure 14:
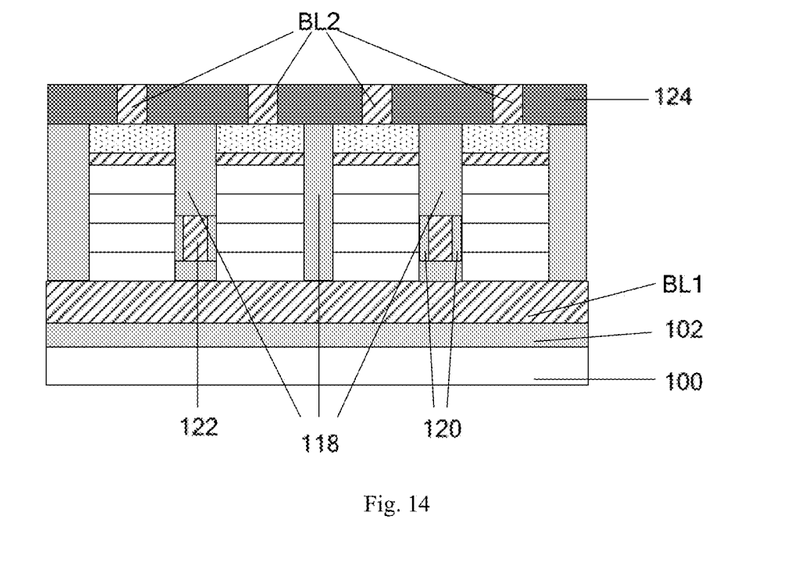

In step S5: a third dielectric layer 124 is formed on the second dielectric layer 118 and on the resistance switching material layer 116 or the phase change material layer 116, and the third dielectric layer 124 is treated to form a plurality of second common electrodes BL2 on each column of memory cells 8 in the second direction. Specifically, as shown in FIG. 14, a dielectric material such as $Si_3N_4$ may be deposited on the second dielectric layer 118 and on the resistance switching material layer 116 or the phase change material layer 116 followed by CMP to form the third dielectric layer 124, then the third dielectric layer 124 is etched to form a plurality of third trenches in the second direction. A width of each third trench is smaller than the length of each memory cell 8 and each third trench is just located on each column of memory cells, and then an electrode material, such as N-type heavily doped polycrystalline silicon or metal is deposited followed by CMP to form the plurality of second common electrodes BL2 in the second direction. Thus, a fabrication process of a first array layer on the substrate is finished.

In step S6: the resistance switching material layer or the phase change material layer, the electrode layer, the fourth semiconductor layer, the third semiconductor layer, the second semiconductor layer and the first semiconductor layer are formed on the plurality of second common electrodes BL2 in succession; then the first semiconductor layer, the second semiconductor layer, the third semiconductor layer, the fourth semiconductor layer, the electrode layer, and the resistance switching material layer or the phase change material layer are etched in succession to form a plurality of memory cells 8 on each second common electrode BL2; and then a fourth dielectric layer is formed to isolate the plurality of memory cells 8. Thus, a second array layer may be formed. Since a fabrication process of the second array layer is the same as that of the first array layer, a detailed description thereof will be omitted here. A plurality of stacked array layers may be formed by repeating step S2 to step S5 on the formed memory array structure. It should be noted that because memory cells in two adjacent array layers are disposed front to front, during the fabrication process, deposition orders of the first, second, third and fourth semiconductor layers, the electrode layer and the resistance switching material layer or the phase change material layer in odd array layers and in even array layers should be reversed. The structural schematic view of the completed three-dimensional memory array structure and the cross-sectional view thereof are shown in FIG. 5 and FIG. 6 respectively. For the brevity, only a part of array structures is shown and all isolation dielectrics are not shown in FIG. 5 and FIG. 6.

The present disclosure provides a vertical selection transistor, a memory cell having the vertical selection transistor, a three-dimensional memory array structure formed by arranging the memory cells in a three-dimensional space and a method for fabricating the three-dimensional memory array structure. By using the vertical selection transistor with high on/off current ratio to form the memory cell, problems such as disturbance between adjacent memory cells and leakage current are effectively improved. In addition, the structure of the memory cell is simplified without dependence on a silicon substrate, a multi-layer stacked structure is realized, and the storage density is increased.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What we claim is:

1. A vertical selection transistor, comprising:
    an upper electrode;
    a lower electrode;
    a first semiconductor layer, a second semiconductor layer, a third semiconductor layer and a fourth semiconductor layer vertically stacked between the lower electrode and the upper electrode; and
    a gate stack formed on a side of the second semiconductor layer,
    wherein the first semiconductor layer and the third semiconductor layer are first type doped layers, the second semiconductor layer and the fourth semiconductor layer are second type doped layers, and a doping concentration of the second semiconductor layer is lower than that of the first semiconductor layer or that of the third semiconductor layer respectively, in which a vertical MOS transistor comprises the first semiconductor layer, the second semiconductor layer, the third semiconductor layer and the gate stack, and a vertical diode comprises the third semiconductor layer and the fourth semiconductor layer; and wherein a thickness of each of the first, second, third and fourth semiconductor layers is within a range from 10 nm to 200 nm.

2. The vertical selection transistor according to claim 1, wherein a material for each of the first, second, third and fourth semiconductor layers is doped polycrystalline silicon or doped polycrystalline germanium.

3. The vertical selection transistor according to claim 1, wherein a thickness of the second semiconductor layer or a thickness of the third semiconductor layer is larger than that of the first semiconductor layer or that of the fourth semiconductor layer.

4. A three-dimensional memory array structure, comprising:
a plurality of array layers, each of the plurality of array layers being stacked with another, each of the plurality of array layers including a plurality of rows of memory cells in a first direction and a plurality of columns of memory cells in a second direction, wherein each memory cell comprises: an upper electrode; a lower electrode; a first semiconductor layer, a second semiconductor layer, a third semiconductor layer and a fourth semiconductor layer vertically stacked between the lower electrode and the upper electrode; and a resistance switching unit or a phase change unit formed on the upper electrode, wherein the first semiconductor layer and the third semiconductor layer are first type doped layers, the second semiconductor layer and the fourth semiconductor layer are second type doped layers, and a doping concentration of the second semiconductor layer is lower than that of the first semiconductor layer or that of the third semiconductor layer,
wherein the plurality of columns of memory cells are divided into a plurality of pair columns of memory cells and a common gate stack is located between the second semiconductor layers of two adjacent memory cells in a same row and belonging to a same pair column.

5. The three-dimensional memory array structure according to claim 4, wherein a material for the resistance switching unit comprises $Ni_xO_y$, $Nb_xO_y$, $Ti_xO_y$, $Hf_xO_y$, $Mg_xO_y$, $Co_xO_y$, $Cr_xO_y$, $V_xO_y$, $Zn_xO_y$, $Al_xO_y$, $Zr_xO_y$, or $Al_xN_y$, in which each of x and y is within a range from 0 to 1.

6. The three-dimensional memory array structure according to claim 4, wherein a material for the phase change unit comprises a Ge-Se-Te chalcogenide compound.

7. The three-dimensional memory array structure according to claim 4, wherein the memory cells in two adjacent array layers are reversely disposed.

8. The three-dimensional memory array structure according to claim 7, wherein the lower electrodes of memory cells of each row of memory cells are connected to form a first common electrode in the first direction, and a second common electrode is provided on the resistance switching units or the phase change units of memory cells of each column of memory cells in the second direction.

9. The three-dimensional memory array structure according to claim 8, wherein each first common electrode or each second common electrode between two adjacent array layers is shared by the two adjacent array layers.

10. The three-dimensional memory array structure according to claim 4, wherein a material for each of the first, second, third and fourth semiconductor layers is doped polycrystalline silicon or doped polycrystalline germanium.

11. The three-dimensional memory array structure according to claim 4, wherein a thickness of each of the first, second, third and fourth semiconductor layers is within a range from 10 nm to 200 nm.

12. The three-dimensional memory array structure according to claim 4, wherein a thickness of the second semiconductor layer or a thickness of the third semiconductor layer is larger than that of the first semiconductor layer or that of the fourth semiconductor layer.

13. The three-dimensional memory array structure according to claim 8, wherein a material for each of the first common electrodes, the second common electrodes, the upper electrode and the lower electrode comprises heavily doped polycrystalline silicon or metal.

14. The three-dimensional memory array structure according to claim 8, wherein isolation dielectrics are filled between adjacent memory cells, between adjacent first common electrodes and between adjacent second common electrodes.

15. The three-dimensional memory array structure according to claim 4, wherein the three-dimensional memory array structure are formed on a substrate with an insulating layer.

16. A method for fabricating a three-dimensional memory array structure, comprising steps of:
A: providing a substrate with an insulating layer;
B: forming a first dielectric layer on the insulating layer, and treating the first dielectric layer to form a plurality of first common electrodes in a first direction;
C: forming a first semiconductor layer, a second semiconductor layer, a third semiconductor layer, a fourth semiconductor layer, an electrode layer and a resistance switching material layer or a phase change material layer on the plurality of first common electrodes in succession;
etching the resistance switching material layer or the phase change material layer, the electrode layer, the fourth semiconductor layer, the third semiconductor layer, the second semiconductor layer, and the first semiconductor layer in succession to form a plurality of rows of memory cells in the first direction and a plurality of columns of memory cells in a second direction; and then forming a second dielectric layer on the first dielectric layer to isolate each memory cell, wherein the first semiconductor layer and the third semiconductor layer are first type doped layers, the second semiconductor layer and the fourth semiconductor layer are second type doped layers, and a doping concentration of the second semiconductor layer is lower than that of the first semiconductor layer or that of the third semiconductor layer;
D: dividing the plurality of columns of memory cells into a plurality of pair columns of memory cells and treating the second dielectric layer between each pair column of memory cells to form a common gate stack between the second semiconductor layers of two adjacent memory cells in a same row and belonging to a same pair column;
E: forming a third dielectric layer on the second dielectric layer and on the resistance switching material layer or the phase change material layer, and treating the third dielectric layer to form a plurality of second common electrodes on each column of memory cells in the second direction; and
F: forming the resistance switching material layer or the phase change material layer, the electrode layer, the fourth semiconductor layer, the third semiconductor layer, the second semiconductor layer and the first semiconductor layer on the plurality of second common electrodes in succession; then etching the first semiconductor layer, the second semiconductor layer, the third semiconductor layer, the fourth semiconductor layer, the electrode layer, and the resistance switching material layer or the phase change material layer in succession to form a plurality of memory cells on each second common electrode; and then forming a fourth dielectric layer to isolate the plurality of memory cells.

17. The method according to claim 16, wherein step B to step F are repeated on the formed memory array structure to form a plurality of stacked array layers.

18. The method according to claim 16, wherein a material for each of the first, second, third and fourth semiconductor layers comprises doped polycrystalline silicon or doped polycrystalline germanium.

19. The method according to claim 16, wherein a material for each of the first common electrodes, the second common electrodes, the upper electrode and the lower electrode comprises heavily doped polycrystalline silicon or metal.

\* \* \* \* \*